US009645500B2

(12) United States Patent
Noordman et al.

(10) Patent No.: US 9,645,500 B2
(45) Date of Patent: May 9, 2017

(54) RADIATION SOURCE AND LITHOGRAPHIC APPARATUS (71) Applicant: ASML Netherlands B.V., Veldhoven (NL)

(72) Inventors: Oscar Franciscus Jozephus Noordman, Eindhoven (NL); Markus Franciscus Antonius Eurlings, Tilburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/910,995

(22) PCT Filed: Jul. 24, 2014

(86) PCT No.: PCT/EP2014/065905
§ 371 (c)(1),
(2) Date: Feb. 8, 2016

(87) PCT Pub. No.: WO2015/028211
PCT Pub. Date: Mar. 5, 2015

(65) Prior Publication Data
US 2016/0195819 A1 Jul. 7, 2016

Related U.S. Application Data (60) Provisional application No. 61/870,128, filed on Aug. 26, 2013.

(51) Int. Cl.
*G03B 27/42* (2006.01)
*G03F 7/20* (2006.01)
(Continued)

(52) U.S. Cl.
CPC ......... *G03F 7/70133* (2013.01); *G02B 27/44* (2013.01); *G02B 27/50* (2013.01);
(Continued)

(58) Field of Classification Search
CPC . H05G 2/008; G03F 7/70033; G03F 7/70191; G03F 7/20; G03F 7/70025;
(Continued)

(56) References Cited

U.S. PATENT DOCUMENTS 4,698,816 A 10/1987 Chun
6,307,913 B1 10/2001 Foster et al.
(Continued)

FOREIGN PATENT DOCUMENTS

DE 10 2010 005774 3/2011
EP 2 538 759 12/2012
(Continued)

OTHER PUBLICATIONS

International Search Report and Written Opinion mailed Oct. 14, 2014 in corresponding International Patent Application No. PCT/EP2014/065905.

*Primary Examiner* — Mesfin Asfaw
(74) *Attorney, Agent, or Firm* — Pillsbury Winthrop Shaw Pittman LLP (57) ABSTRACT

A radiation source includes a nozzle configured to direct a stream of fuel droplets along a droplet path towards a plasma formation location, and is configured to receive a gaussian radiation beam having gaussian intensity distribution, having a predetermined wavelength and propagating along a predetermined trajectory, and further configured to focus the radiation beam on a fuel droplet at the plasma formation location. The radiation source includes a phase plate structure including one or more phase plates. The phase plate structure has a first zone and a second zone. The zones are arranged such that radiation having the predetermined wavelength passing through the first zone and radiation having the predetermined wavelength passing through the second zone propagate along respective optical paths having different optical path lengths. A difference between the optical
(Continued)

path lengths is an odd number of times half the predetermined wavelength.

20 Claims, 3 Drawing Sheets (51) Int. Cl.
*H05G 2/00* (2006.01)
*G02B 27/44* (2006.01)
*G02B 27/50* (2006.01)
*H01S 3/23* (2006.01)
*H01S 3/13* (2006.01)
*H01S 3/00* (2006.01)

(52) U.S. Cl.
CPC ......... *G03F 7/70041* (2013.01); *H05G 2/006* (2013.01); *H05G 2/008* (2013.01); *H01S 3/005* (2013.01); *H01S 3/1307* (2013.01); *H01S 3/2391* (2013.01)

(58) Field of Classification Search
CPC .. G03F 7/2004; G03F 7/70008; G03F 7/7055; H01S 3/005; H01S 3/1643; H01S 3/2391; H01S 3/23; H01S 2301/02; H01S 3/0078; H01S 3/0085; H01S 3/1307; H01S 3/2308; H01S 3/2325
See application file for complete search history.

(56) References Cited

U.S. PATENT DOCUMENTS

| 2010/0315709 | A1 | 12/2010 | Baer |
| 2012/0146507 | A1 | 6/2012 | Yanagida et al. |
| 2012/0243566 | A1* | 9/2012 | Hori ..................... H01S 3/10061 372/27 |
| 2013/0119232 | A1 | 5/2013 | Moriya et al. |
| 2013/0135601 | A1 | 5/2013 | Okazaki et al. |

FOREIGN PATENT DOCUMENTS

| WO | 2012/173166 | 12/2012 |
| WO | 2012/173266 | 12/2012 |

* cited by examiner

RADIATION SOURCE AND LITHOGRAPHIC APPARATUS

CROSS-REFERENCE TO RELATED APPLICATIONS

This application is the U.S. national phase entry of PCT patent application no. PCT/EP2014/065905, which was filed on Jul. 24, 2014, which claims the benefit of priority of U.S. provisional application No. 61/870,128, which was filed on Aug. 26, 2013, and which is incorporated in its entirety by reference.

FIELD

The present invention relates to a radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser source for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Another known method of producing EUV radiation is known as dual laser pulsing (DLP). In the DLP method droplets are pre-heated, for instance by a neodymium-doped yttrium aluminium garnet (Nd:YAG) laser to cause the droplet (e.g., a tin droplet) to decompose into vapor and small particles that are then heated to a very high temperature by a $CO_2$ laser.

In known methods such as LPP and DLP methods, a stream of droplets is generated. The droplets may be generated as either a continuous stream or in pulses.

For example, in one known method that is used in particular for LPP methods, a heated container is filled with molten tin that passes from the container to a capillary via a filter and a piezoelectric actuator. A continuous jet exits from the end of the capillary that is modulated in velocity by the piezoelectric actuator. During flight, this jet decomposes into small droplets and due to the modulated velocity, these smaller droplets merge into larger droplets spaced at larger distances.

The laser beam that pre-heats the droplet to cause the droplet to decompose into vapor and small particles may be slightly misaligned with respect to the droplet it pre-heats. Such slight misalignment may cause further misalignment when the $CO_2$ laser heats the vapor and the small particles to the very high temperature. Such further misalignment may be detrimental to the amount of EUV radiation emitted by the resulting plasma.

SUMMARY

According to an aspect of the invention, there is provided a radiation source that includes a nozzle configured to direct a stream of fuel droplets along a droplet path towards a plasma formation location. The radiation source is configured to receive a gaussian radiation beam having gaussian intensity distribution, having a predetermined wavelength and propagating along a predetermined trajectory. The radiation source is further configured to focus the radiation beam on a fuel droplet at the plasma formation location. The radiation source includes a phase plate structure comprising one or more phase plates. The phase plate structure has a first zone and a second zone. The zones are arranged such that radiation having the predetermined wavelength passing through the first zone and radiation having the predetermined wavelength passing through the second zone propagate along respective optical paths having different optical path lengths. A difference between the optical path lengths between the radiation passing through the first zone and the radiation passing through the second zone is an odd number of times half the predetermined wavelength when the radiation passing through the first zone and the radiation passing through the second zone hit one of the fuel droplets at the plasma formation location.

An effect of this aspect is that it offers the possibility to adjust a profile of the radiation beam such that, at the plasma formation location, the profile is flatter and wider.

Increasing the tolerance in the alignment requirement for the radiation beam with respect to the droplet may solve the issue that a slight misalignment will be detrimental to the amount of EUV radiation emitted.

The radiation passing through the first zone and the radiation passing through the second zone may be different parts of the gaussian radiation beam. The radiation passing through the first zone may include at least a top of the intensity distribution. The radiation passing through the second zone may be located at a distance from a top of the intensity distribution, which may offer the possibility of bringing at least part of the sides of the curve of the gaussian distribution in antiphase with the top of the intensity distribution According to an aspect of the invention, the phase plate structure includes two phase plates, at least one of the phase plates including at least a first area and a second area, wherein radiation having the predetermined wavelength passing through the first area and radiation having the predetermined wavelength passing through the second area propagate along respective optical paths, a difference between the optical path lengths between the radiation passing through the first area and the radiation passing through the second area being an odd number of times half the predetermined wavelength at a location on the trajectory of the radiation beam downstream relative to the phase plate.

According to an aspect of the invention, the phase plate structure includes two phase plates, at least two of the phase plates including at least a first area and a second area, wherein radiation having the predetermined wavelength passing through the first area and radiation having the predetermined wavelength passing through the second area propagate along respective optical paths, a difference between the optical path lengths between the radiation passing through the first area and the radiation passing through the second area being an odd number of times half the predetermined wavelength at a location on the trajectory of the radiation beam downstream relative to the phase plate.

The one or more phase plates may be made of ZnSe and/or ZnS.

Further features and advantages as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding or functionally similar parts, and in which.

DETAILED DESCRIPTION

It is noted that reference in this specification to "one embodiment," "an embodiment," "an example embodiment," etc., indicate that the embodiment described may include a particular feature, structure, or characteristic, but not every embodiment may necessarily include the particular feature, structure, or characteristic. Moreover, such phrases are not necessarily referring to the same embodiment. Further, when a particular feature, structure, or characteristic, is described in connection with an embodiment, it is submitted that it is within the knowledge of one skilled in the art to effect such feature, structure, or characteristic, in connection with other embodiments whether or not explicitly described.

Figure 1:
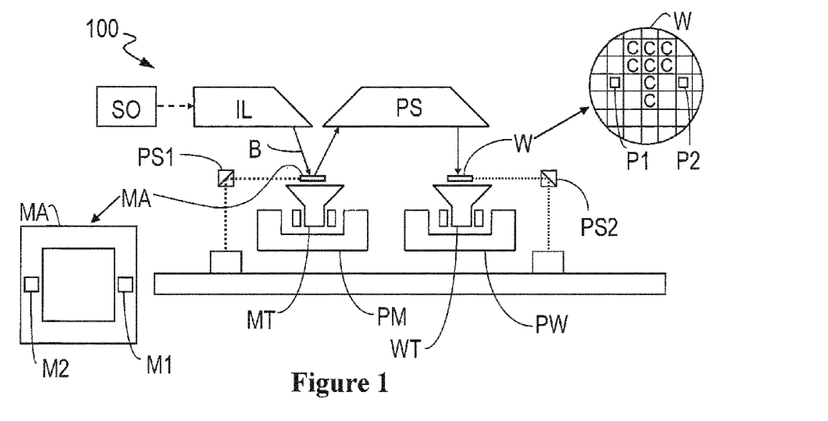
FIG. 1 schematically depicts a lithographic apparatus according to an embodiment of the invention.

FIG. 1 schematically depicts a lithographic apparatus 100 according to an embodiment. The lithographic apparatus includes an EUV radiation source. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate W (e.g., a resist-coated wafer) and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the desired plasma can be produced by irradiating a fuel, such as a droplet of material having the desired line-emitting element, with a laser beam. The source collector module SO may be part of an EUV radiation source including a laser, not shown in FIG. 1, for providing the laser beam exciting the fuel. The resulting plasma emits output radiation, e.g., EUV radiation, which is collected using a radiation collector, disposed in the source collector module SO.

The laser and the source collector module may be separate entities, for example when a $CO_2$ laser is used to provide the laser beam for fuel excitation. In such cases, the radiation beam is passed from the laser to the source collector module with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensing system PS2 (e.g., using interferometric devices, linear encoders or capacitive sensors), the substrate table WT can be moved accurately, e.g., so as to position different target portions C in the path of the radiation beam B. Similarly, the first positioner PM and another position sensing system PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
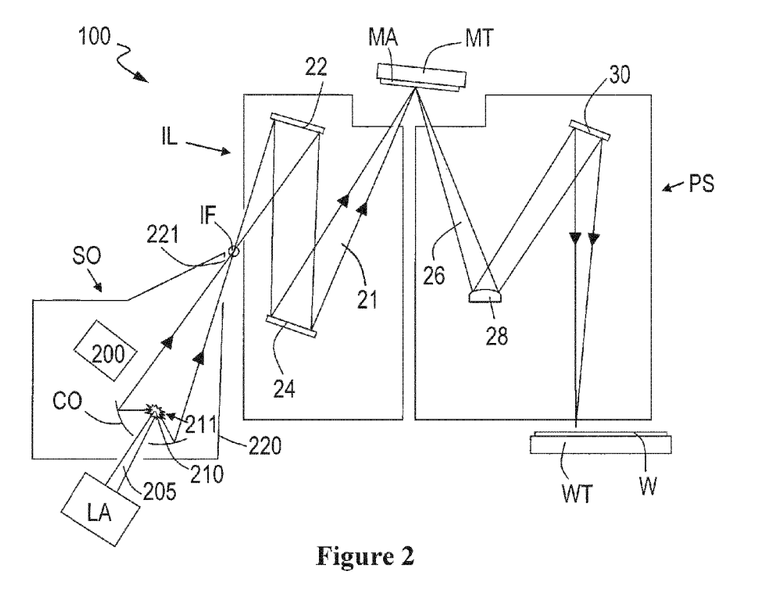
FIG. 2 depicts a more detailed view of the apparatus of FIG. 1 including a source collector module having a normal incidence mirror.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module.

A laser source LA is arranged to deposit laser energy via a laser beam 205 into a fuel, such as xenon (Xe), tin (Sn) or lithium (Li) which is provided from a fuel droplet stream generator 200 having a nozzle configured to direct a stream of droplets along a path toward a plasma formation location 211. This creates a highly ionized plasma 210 at the plasma formation location 211 which has electron temperatures of several 10's of eV. The energetic radiation generated during de-excitation and recombination of these ions is emitted from the plasma, collected and focused by a near normal incidence radiation collector CO. The laser system LA and fuel droplet stream generator 200 may together be considered to comprise an EUV radiation source. The EUV radiation source may be referred to as a laser produced plasma (LPP) source.

Radiation that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

Figure 3:
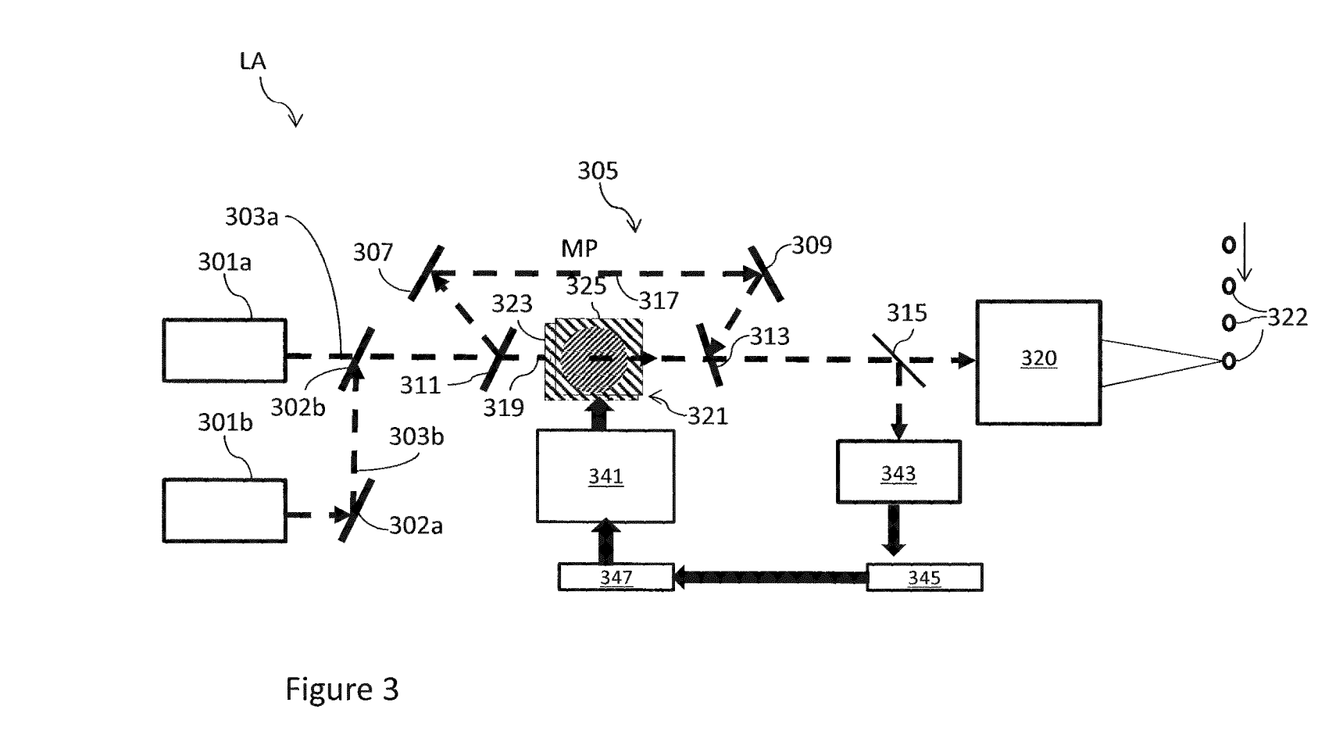
FIG. 3 schematically depicts a beam delivery system of the source collector module shown in FIG. 2.

The laser system LA may be used to preheat the fuel. This is depicted in FIG. 3. FIG. 3 schematically discloses the laser system LA. The laser source LA comprises two laser sources 301a, 301b constructed and arranged to generate radiation beams 303a, 303b in pulsed form. Main pulse laser source 301a may be configured to generate radiation having a wavelength of 10.59 μm and pre-pulse laser source 301b may be configured to generate radiation having a wavelength of 10.23 μm. Mirror 302a and beam splitter 302b reflect the radiation having a wavelength of 10.23 μm as shown in FIG. 3.

The embodiment of FIG. 3 is configured such, that, in use, laser source 301b is triggered first to generate a pulse and, for instance, 1 μs later, the laser source 301a is triggered to generate a pulse.

The laser system LA comprises a beam delivery system 305. The beam delivery system 305 includes reflectors 307, 309 and beam splitters 311, 313, 315. The reflectors 307, 309 and the beam splitters 311, 313, 315 are configured such that the radiation beam propagates along a predetermined main trajectory 317 and a predetermined pre-pulse trajectory 319. The beam splitter 311 is configured to reflect radiation having a wavelength of about 10.59 μm and transmit radiation having a wavelength about 10.23 μm. Thus, pulses generated by laser source 301a propagate along trajectory 317 and pulses generated by laser source 301b propagate along trajectory 319. Both trajectories 317, 319 pass through focusing unit 320, which focuses the radiation beam at the plasma formation location 211 to hit one of the droplets 322.

Figure 4:
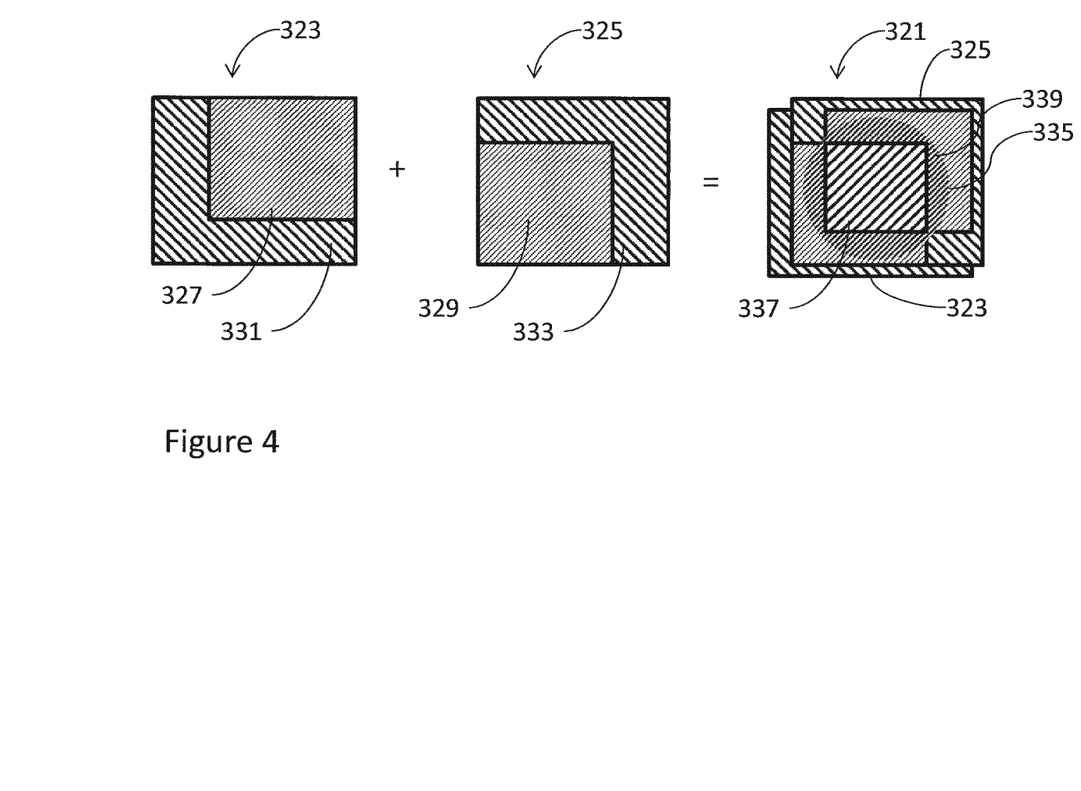
FIG. 4 schematically depicts a phase plate structure of the beam delivery system of FIG. 4.

The beam delivery system 305 of FIG. 3 includes a phase plate structure 321, which is depicted in more detail in FIG. 4. The phase plate structure 321 includes a first phase plate 323 and a second phase plate 325. Each of the phase plates 323, 325 includes a first area 327, 329 and a second area 331, 333. The phase plates 323, 325 are positioned and oriented such that a part of the laser beam 303 propagating along the predetermined pre-pulse trajectory 319 propagates through both the first phase plate 323 and the second phase plate 325.

Each of the phase plates 323, 325 is constructed and arranged such that radiation from the radiation beam 303 passing through the first area 327, 329 and radiation having radiation from the radiation beam 303 passing through the second area 331, 333 have a difference in optical path length. This difference may be an odd number of times half the wavelength of the radiation beam 303. Such a wavelength may be the wavelength of the radiation of the pre-pulse laser source 301b, in this embodiment about 10.23 μm.

In FIG. 4, a cross-section 335 of the radiation beam 303 is shown. A part of the radiation beam passes through a first zone 337 and another part of the radiation beam passes through a second zone 339. As a skilled person will readily acknowledge, this results in a phase shift that causes the radiation that was transmitted through the first zone 337 to be in antiphase with respect to the radiation that was transmitted through the second zone 339, if the radiation of the radiation beam 303 was in-phase upstream with respect to the phase plate structure 321. The size of the first zone 337 is determined by the position of the first phase plate 323 and the second phase plate 325, one or both of which are determined by an actuator system 341 shown in FIG. 3.

Going back to FIG. 3, the final focus metrology unit 343 which provides data 345 concerning an intensity profile and a wavefront of the radiation beam 303. A data processing system 347 calculates a beam profile near a focus of the combination of the focusing unit 320 and beam splitters 313, 315. This may be where the radiation beam passes through the phase plate structure 321. The data processing system 347 operates the actuator system 341 that positions the phase plates 323, 325 with respect to part of the radiation beam that passes along trajectory 319.

The position of the phase plates 323, 325 is operated in such a way that the beam cross-section in the plasma formation location 211 that propagated along pre-pulse trajectory 319 is not gaussian, but has a more flattened profile.

In operation, pre-pulse laser source 302b generates a pulse first. The pulse propagates along the trajectory 319 through the phase plate structure 321. This causes the wavefront of the pulse to be flattened as explained above. The pulse irradiates a droplet 322 which vaporizes into a pancake-shaped cloud. Then, the main pulse laser source 302a is triggered and generates a pulse which propagates along the trajectory 317 and hits the cloud to generate an EUV-emitting plasma.

It should be understood that many variations and modifications are possible without deviating from the invention. Instead of the pre-pulse laser source mentioned above which may be a $CO_2$ laser, a neodymium-doped yttrium aluminium garnet (Nd:YAG) laser may be used generating radiation having a wavelength of, for instance about 1.064 μm.

More elements than shown may generally be present in the illumination system IL and projection system PS. Furthermore, there may be more mirrors present than those shown in the figures, for example there may be 1-6 additional reflective elements present in the projection system PS than shown in FIG. 2. One feature of the source collector module SO which is worthy of note is that the laser source is angled which means that the stream of fuel droplets supplied to the laser source LA should be substantially horizontal to avoid fuel droplets striking the collector CO.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LED's, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A radiation source comprising:
    a nozzle configured to direct a stream of fuel droplets along a droplet path towards a plasma formation location;
    the radiation source being configured to receive a gaussian radiation beam having gaussian intensity distribution, having a predetermined wavelength and propagating along a predetermined trajectory, the radiation source further being configured to focus the radiation beam on a fuel droplet at the plasma formation location;
    a phase plate structure comprising one or more phase plates, the phase plate structure having a first zone and a second zone, the zones being arranged such that radiation having the predetermined wavelength passing through the first zone and radiation having the predetermined wavelength passing through the second zone propagate along respective optical paths having different optical path lengths,
    wherein a difference between the optical path lengths between the radiation passing through the first zone and the radiation passing through the second zone is an odd number multiplied by the value of half the predetermined wavelength when the radiation passing through the first zone and the radiation passing through the second zone hit one of the fuel droplets at the plasma formation location.

2. The radiation source of claim 1, wherein the radiation passing through the first zone and the radiation passing through the second zone are different parts of the gaussian radiation beam.

3. The radiation source of claim 2, wherein the radiation passing through the first zone comprises at least a top of the intensity distribution.

4. The radiation source of claim 2, wherein the radiation passing through the second zone is located at a distance from a top of the intensity distribution.

5. The radiation source of claim 1, wherein the phase plate structure comprises at least two phase plates, at least one of the phase plates comprising at least a first area and a second area, wherein radiation having the predetermined wavelength passing through the first area and radiation having the predetermined wavelength passing through the second area propagate along respective optical paths, a difference in optical path length between the radiation passing through the first area and the radiation passing through the second area being an odd number multiplied by the value of half the predetermined wavelength at a location on the trajectory of the radiation beam downstream relative to the at least one phase plate.

6. The radiation source of claim 1, wherein the phase plate structure comprises at least two phase plates, at least two of the phase plates comprising at least a first area and a second area, wherein radiation having the predetermined wavelength passing through the first area and radiation having the predetermined wavelength passing through the second area propagate along respective optical paths, a difference between the optical path lengths between the radiation passing through the first area and the radiation passing through the second area being an odd number multiplied by the value of half the predetermined wavelength at a location on the trajectory of the radiation beam downstream relative to the at least two phase plates.

7. The radiation source of claim 6, wherein the at least two phase plates determine the difference between the optical path lengths between the radiation passing through the first zone and the radiation passing through the second zone.

8. The radiation source of claim 7, wherein the at least two phase plates are moveable with respect to the radiation beam in a direction transverse to the radiation beam such that a size and/or location of the first zone and/or a size and/or location of the second zone is/are adjustable.

9. The radiation source of claim 1, wherein the predetermined wavelength is between 9 μm and 11 μm.

10. The radiation source of claim 1, wherein the predetermined wavelength is between 900 nm and 1100 nm.

11. A radiation system comprising a radiation source of claim 1 constructed and arranged to generate extreme ultraviolet radiation and a laser source to provide the radiation having the predetermined wavelength.

12. The radiation system of claim 11, wherein the radiation system is constructed and arranged to provide a pre-pulse to hit the fuel droplet at the plasma formation location and a subsequent main pulse to hit said fuel droplet at the plasma formation location, after the fuel droplet has been hit by the pre-pulse, to generate an extreme ultraviolet radiation-generating plasma.

13. The radiation system of claim 12, wherein the radiation system is configured such that, in use, the laser source generates the pre-pulse and the subsequent main pulse.

14. The radiation system of claim 12, wherein the radiation system is configured such that, in use, the laser source generates the pre-pulse and wherein the radiation system comprises a further laser source, the radiation system being configured such that, in use, the further laser source generates the main pulse.

15. A lithographic apparatus comprising',
    a radiation source comprising:
        a nozzle configured to direct a stream of fuel droplets along a droplet path towards a plasma formation location, and
        a phase plate structure comprising one or more phase plates, the phase plate structure having a first zone and a second zone, the zones being arranged such that radiation having a gaussian intensity distribution and having a predetermined wavelength passing through the first zone and radiation having the gaussian intensity distribution and the predetermined wavelength passing through the second zone, propagate along respective optical paths having different optical path lengths,
        wherein a difference between the optical path lengths between the radiation passing through the first zone and the radiation passing through the second zone is an odd number multiplied by the value of half the predetermined wavelength when the radiation passing through the first zone and the radiation passing through the second zone hit one of the fuel droplets at the plasma formation location; and a projection system configured to receive radiation from the plasma formation location and project the received radiation onto a radiation-sensitive substrate.

16. A method, comprising:

directing a stream of fuel droplets along a droplet path towards a plasma formation location;

receiving a gaussian radiation beam having gaussian intensity distribution, having a predetermined wavelength and propagating along a predetermined trajectory;

focusing the radiation beam on a fuel droplet at the plasma formation location;

passing the radiation having the predetermined wavelength through a first zone of a phase plate structure comprising one or more phase plates, so as to propagate along a first optical path having an optical path length;

passing radiation having the predetermined wavelength through a second zone of the phase plate structure so as to propagate along a second optical path having a different optical path length than the first optical path, wherein a difference between the optical path lengths between the radiation passing through the first zone and the radiation passing through the second zone is an odd number multiplied by the value of half the predetermined wavelength when the radiation passing through the first zone and the radiation passing through the second zone hit one of the fuel droplets at the plasma formation location.

17. The method of claim 16, wherein the radiation passing through the first zone and the radiation passing through the second zone are different parts of the gaussian radiation beam.

18. The method of claim 16, wherein the phase plate structure comprises at least two phase plates, at least one of the phase plates comprising at least a first area and a second area, wherein radiation having the predetermined wavelength passing through the first area and radiation having the predetermined wavelength passing through the second area propagate along respective optical paths, a difference in optical path length between the radiation passing through the first area and the radiation passing through the second area being an odd number multiplied by the value of half the predetermined wavelength at a location on a trajectory of the radiation beam downstream relative to the at least one phase plate.

19. The method of claim 16, wherein the predetermined wavelength is between 9 μm and 11 μm.

20. The method of claim 16, wherein the predetermined wavelength is between 900 nm and 1100 nm.

* * * * *